(12) United States Patent
Kang et al.

(10) Patent No.: US 7,335,923 B2
(45) Date of Patent: Feb. 26, 2008

(54) ELECTROLUMINESCENCE DISPLAY DEVICE

(75) Inventors: Tae-Wook Kang, Suwon-si (KR); Chang-Su Seo, Suwon-si (KR); Moon-Hee Park, Suwon-si (KR); Ho-Jin Kang, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 103 days.

(21) Appl. No.: 11/138,322

(22) Filed: May 27, 2005

(65) Prior Publication Data

US 2005/0280002 A1 Dec. 22, 2005

(30) Foreign Application Priority Data

Jun. 17, 2004 (KR) .................. 10-2004-0045029

(51) Int. Cl.
*H01L 29/04* (2006.01)
(52) U.S. Cl. .................. 257/81; 257/72; 257/91; 257/99; 257/E27.1
(58) Field of Classification Search .................. 257/72, 257/E27.1, 81, 91, 99
See application file for complete search history.

(56) References Cited

U.S. PATENT DOCUMENTS 6,081,310 A * 6/2000 Katsuya et al. ............. 349/113
6,323,521 B1 * 11/2001 Seo .......................... 257/347
6,509,942 B2 * 1/2003 Tanaka et al. .............. 349/113
6,597,121 B2 * 7/2003 Imura ...................... 315/169.3
7,122,954 B2 * 10/2006 Nozawa ..................... 313/500
2004/0195572 A1 * 10/2004 Kato et al. .................... 257/72
2006/0145159 A1 * 7/2006 Yokoyama et al. .......... 257/72

* cited by examiner

*Primary Examiner*—Eugene Lee
(74) *Attorney, Agent, or Firm*—H.C. Park & Associates, PLC

(57) ABSTRACT

An electroluminescence display device that includes a thin film transistor layer formed on a substrate, at least one insulating layer formed on the thin film transistor layer, and a pixel layer, disposed on the insulating layer and including a first electrode layer, a second electrode layer, and an intermediate layer having at least an emitting layer interposed between the first electrode layer and the second electrode layer. The pixel layer includes a reflection layer that contacts either a source or drain electrode of the thin film transistor layer and is disposed below the first electrode layer, and the reflection layer includes a through hole through which the first electrode layer contacts either the source electrode or the drain electrode.

10 Claims, 13 Drawing Sheets

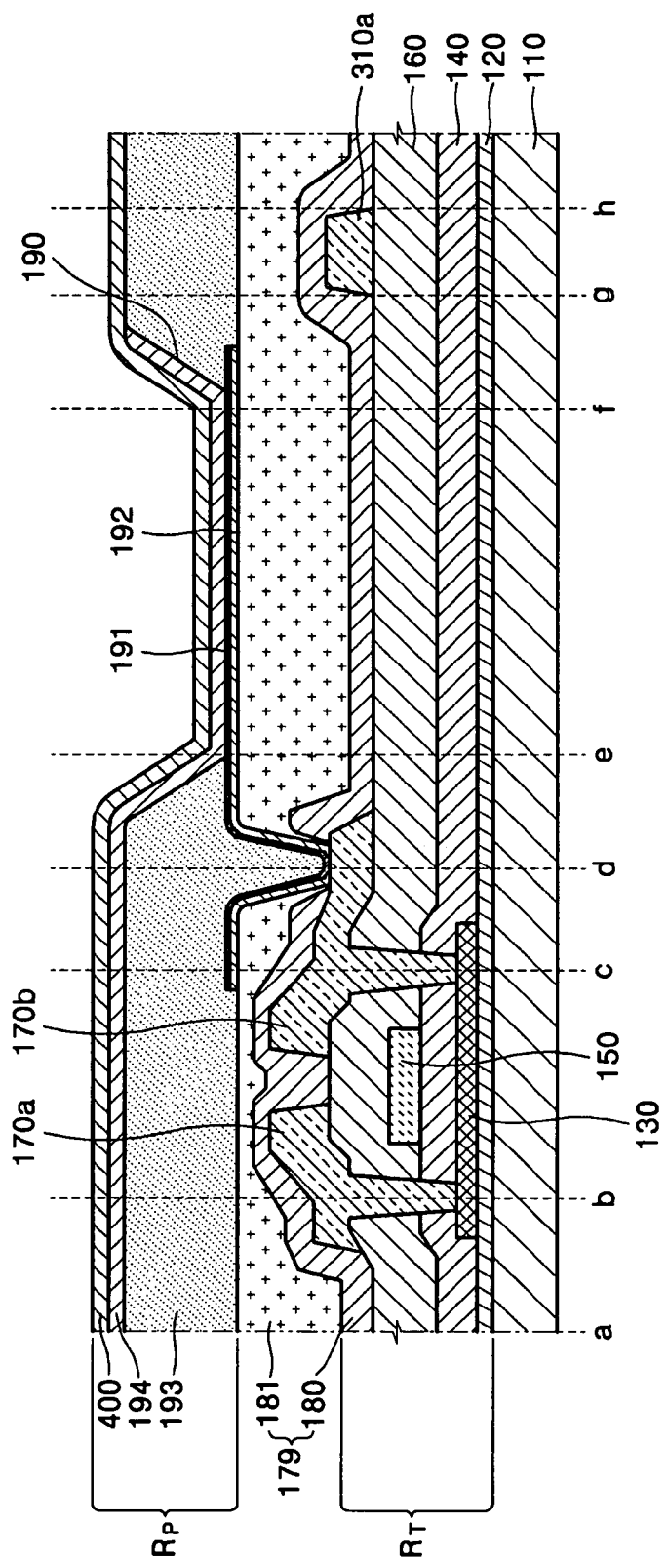

ELECTROLUMINESCENCE DISPLAY DEVICE

CROSS REFERENCE TO RELATED APPLICATION

This application claims priority to and the benefit of Korean Patent Application No. 10-2004-0045029, filed on Jun. 17, 2004, which is hereby incorporated by reference for all purposes as if fully set forth herein.

BACKGROUND OF THE INVENTION

1. Field of the Invention

The present invention relates to an electroluminescence display device, and more particularly, to an electroluminescence display device that may prevent brightness non-uniformity due to a voltage drop in a display region.

2. Discussion of the Background

Various flat panel display devices have been recently developed to replace the conventional cathode ray tube (CRT). The flat panel display devices may be emissive or non-emissive types. The emissive types, which do not require a light source, include flat CRTs, plasma display panel devices, vacuum fluorescent display devices, field emission display devices, and inorganic/organic electroluminescent display devices, and the non-emissive type includes liquid crystal display devices. The organic electroluminescent display device has drawn much attention since it is an emissive type device, and it may be highly efficient and does not consume a lot of power.

The organic electro-luminescent display device emits light having a specific wavelength by energy generated from excitons, which form when electrons and holes, injected through an anode and a cathode, recombine in an organic thin film. The organic electro-luminescent display device may operate with a low voltage, it is thin and light weight, and it may have a wide viewing angle and a quick response time.

An organic electro-luminescent unit of the organic electro-luminescent display device includes a first electrode (an anode), an intermediate layer including at least an organic emitting layer (EML), and a second electrode (a cathode) stacked on a substrate. The organic EML emits light when electrons and holes recombine to form excitons. Electrons and holes may be transferred to the organic EML to increase light emitting efficiency. Accordingly, the intermediate layer may also include an electron transport layer (ETL) disposed between the cathode and the organic EML and a hole transport layer (HTL) disposed between the anode and the organic EML. Further, a hole injection layer (HIL) can be disposed between the anode and the HTL, and an electron injection layer (EIL) can be disposed between the cathode and the ETL.

The organic electro-luminescent display device may be a passive matrix (PM) or active matrix (AM) type depending upon its driving method. In the PM display device, the anodes and the cathodes are simply arranged in columns and rows, respectively, and scanning signals may be sequentially supplied to single cathodes from a row driving circuit. Also, data signals are supplied to each pixel from a column driving circuit. On the other hand, the AM display device controls signals inputted to each pixel using a thin film transistor (TFT). Therefore, the AM device is widely used to display moving images since it can process a large number of signals.

FIG. 1A is a plan view showing a conventional AM organic electroluminescent display device, and FIG. 1B is a cross-sectional view taken along line I-I in FIG. 1A.

The AM organic electroluminescent display device of FIG. 1A has a predetermined display region 20 that includes an organic light emitting diode (OLED) on a transparent substrate 11, and a sealing member (not shown), such as a metal cap, to seal the display region 20 along with the sealing unit 80. The display region 20 comprises a plurality of pixels that include an OLED and a thin film transistor (TFT). A plurality of driving lines VDD 31 may be disposed in the display region 20. The driving lines 31 supply power to the display region 20, and they are coupled to a terminal region 70 through a driving power supply line 32, which may be disposed outside the display region 20.

As FIG. 1B shows, a TFT layer 10a, for applying electrical signals to an electroluminescent unit in the display region 20, may be formed on a surface of a substrate 11, and a pixel layer 10c, which includes an electroluminescent unit, may be formed on the TFT layer 10a. An insulating layer 10b may be interposed between the TFT layer 10a and the pixel layer 10c. The TFT layer 10a includes a semiconductor active layer 13, which may be formed on a buffer layer 12. A gate insulating layer 14 is formed on the semiconductor active layer 13 and the buffer layer 12, and a gate electrode 15 is formed on the gate insulating layer 14 at a position corresponding to a channel region of the semiconductor active layer 13. An interlayer insulator 16 may be formed on the gate electrode 15 and gate insulating layer 14, and the source and drain electrodes 17a and 17b are formed on the interlayer insulator 16.

A via hole formed in the insulating layer 10b may electrically connect the TFT layer 10a and the pixel layer 10c. FIG. 1C is a magnified cross-sectional view of portion "A" in FIG. 1B. A first insulating layer 18a may be formed on the source and drain electrodes 17a and 17b, a second insulating layer 18b may be formed on the first insulating layer 18a, and via holes 18'a and 18'b may be formed in the insulating layers 18a and 18b.

With a front emitting electroluminescence display device, a reflection layer 19b may be formed under a first electrode layer 19a that supplies electrical signals to an intermediate layer 19c. The first electrode layer 19a and the reflection layer 19b extend to the via holes 18'a and 18'b and are electrically connected to the drain electrode 17b of the TFT layer 10a. A second electrode layer 40 may be formed over the display region.

Here, the first electrode layer 19a may be formed of a transparent conductive oxide such as, for example, indium tin oxide (ITO), having a large work function, and the reflection layer 19b may be formed of Al or AlNd. However, the transmission of electrical signals from the drain electrode 17b to the intermediate layer disposed in an opened region of a pixel defining layer 19d may be adversely affected by the reduction of conductivity by an interface oxide layer formed between the first electrode layer 19a, formed of ITO, and the metal reflection layer 19b, formed of AlNd. This can reduce brightness or cause brightness non-uniformity in the display region, thereby reducing image quality.

SUMMARY OF THE INVENTION

The present invention provides an electroluminescence display device having a structure that may prevent brightness non-uniformity due to a voltage drop in a display region.

Additional features of the invention will be set forth in the description which follows, and in part will be apparent from the description, or may be learned by practice of the invention.

The present invention discloses an electroluminescence display device including a thin film transistor layer on a substrate, at least one insulating layer on the thin film transistor layer, and a pixel layer that includes a first electrode layer, a second electrode layer, and an intermediate layer having at least an emitting layer interposed between the first electrode layer and the second electrode layer, and is disposed on the insulating layer. The pixel layer also includes a reflection layer that contacts either a source electrode or a drain electrode of the thin film transistor layer, and is disposed below the first electrode layer. The reflection layer includes a through hole through which the first electrode layer contacts either the source electrode or the drain electrode.

The present invention also discloses a method of manufacturing an electroluminescence display device, including forming a thin film transistor layer on a substrate, forming at least one insulating layer on the thin film transistor layer, forming a via hole in at least one insulating layer to expose either a source electrode or a drain electrode of the thin film transistor layer, forming a reflection layer that includes a through hole and that contacts the exposed source electrode or drain electrode through the via hole, and forming a pixel layer that comprises at least one pixel and includes a first electrode layer, an intermediate layer having at least an emitting layer, and a second electrode layer. The first electrode layer is formed on the reflection layer, and the first electrode layer contacts the exposed source electrode or drain electrode through the through hole.

The present invention also discloses an electroluminescence display device including a plurality of pixels in a display region, and a thin film transistor and a light emitter in a pixel. The light emitter includes a reflective layer and a first electrode layer. The light emitter is coupled to an electrode of the thin film transistor through a via hole in an insulating layer, and the reflective layer and the first electrode layer contact the electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 2C is a cross-sectional view taken along line II-II in FIG. 2B.

DETAILED DESCRIPTION OF THE ILLUSTRATED EMBODIMENTS

Figure 1A:
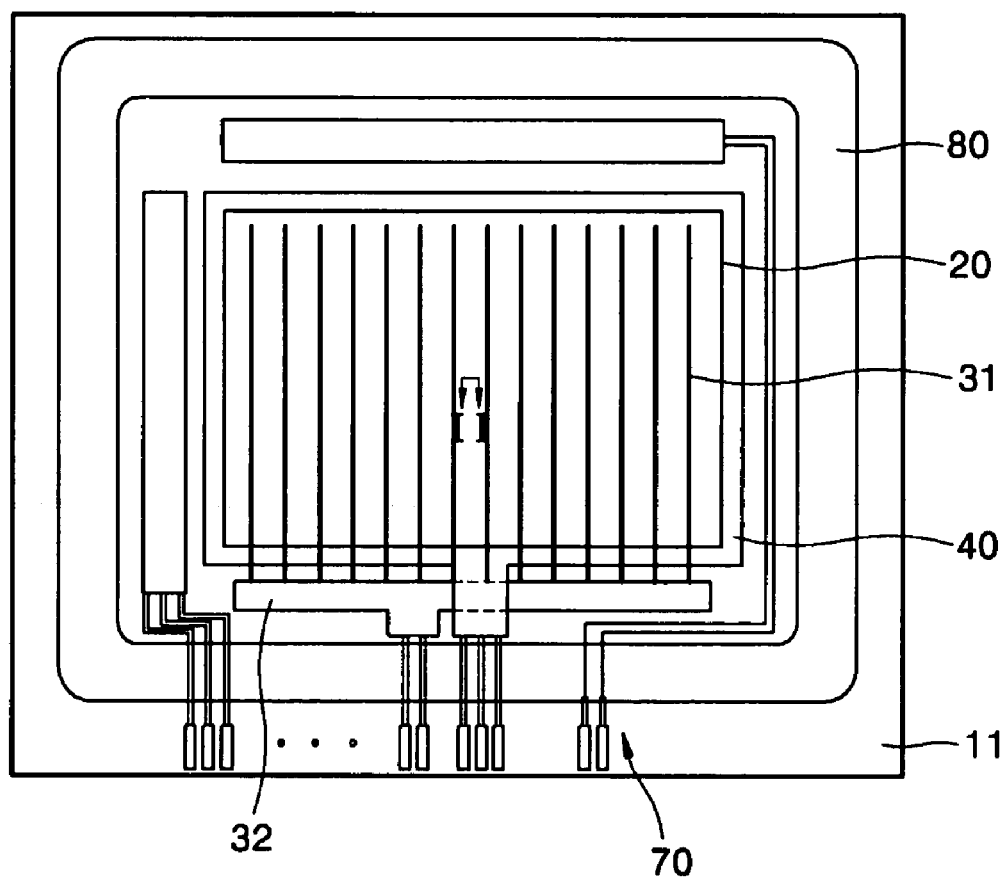
FIG. 1A is a plan view showing a conventional organic electroluminescence display device.
Figure 1B:
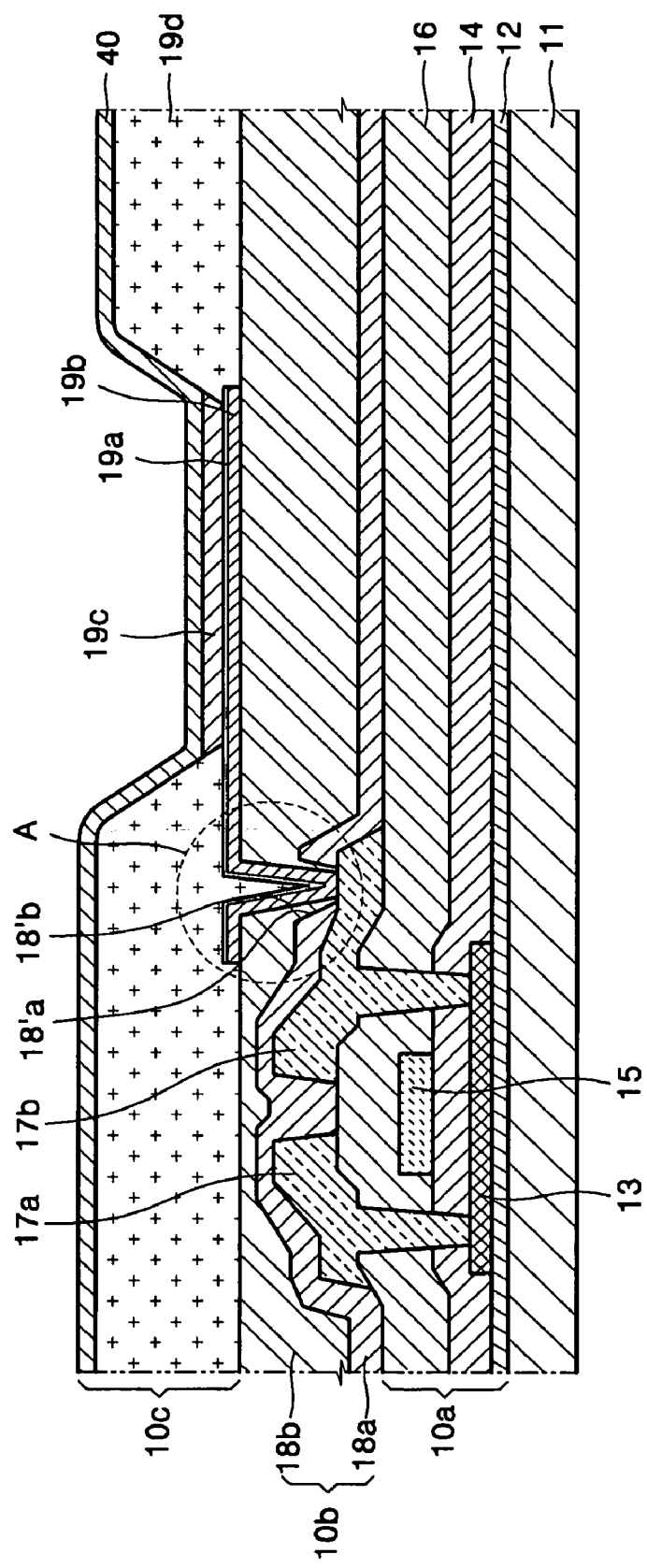
FIG. 1B is a cross-sectional view taken along line I-I of FIG. 1A.
Figure 1C:
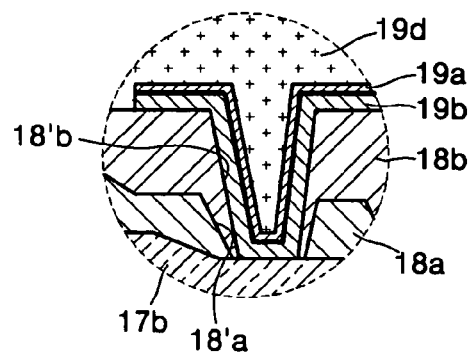
FIG. 1C is a magnified cross-sectional of portion "A" of FIG. 1B.
Figure 2A:
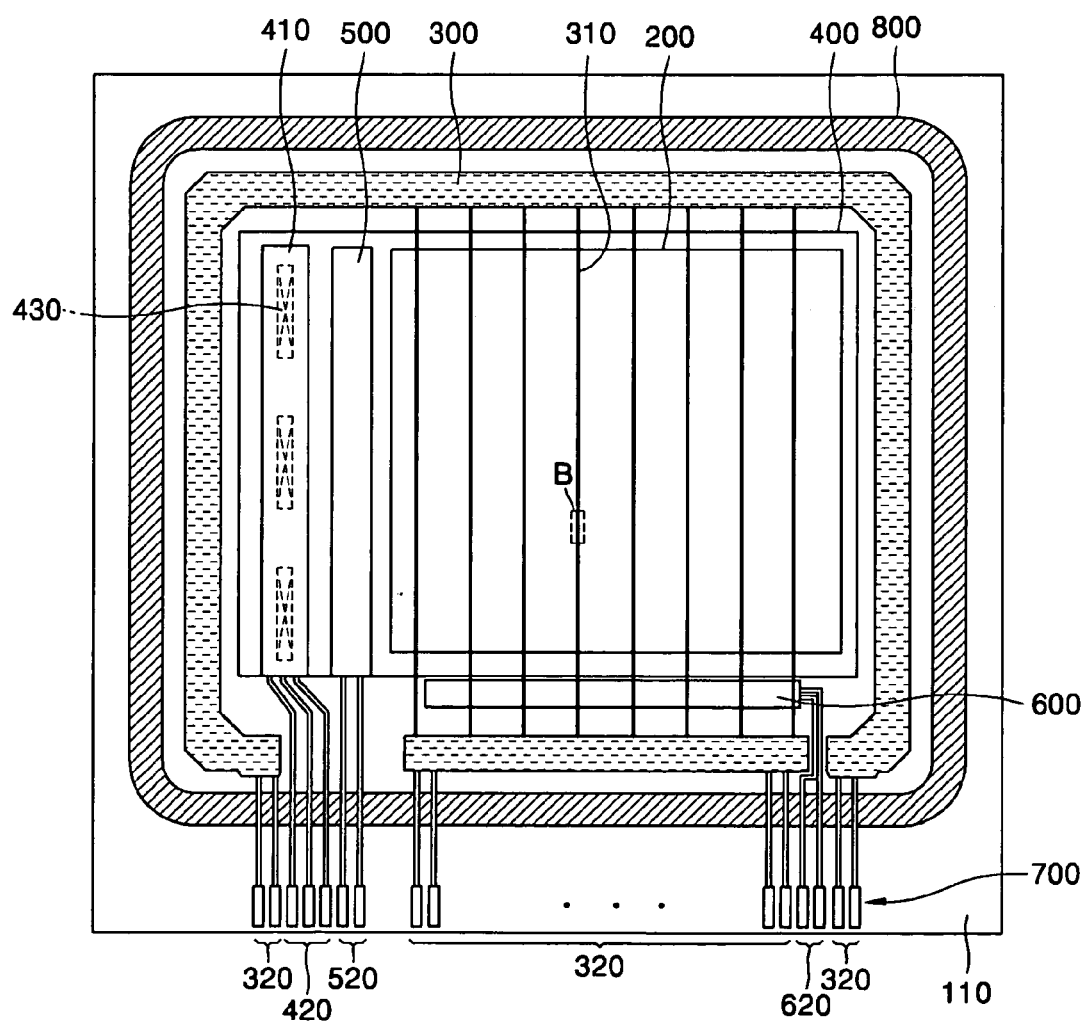
FIG. 2A is a plan view showing an organic electroluminescence display device according to an exemplary embodiment of the present invention.

FIG. 2A is a plan view showing an organic electroluminescent display device according to an exemplary embodiment of the present invention. Like reference numerals refer to like elements throughout the drawings.

Referring to FIG. 2A, the organic electroluminescent display device may include a display region 200 on a surface of the substrate 110, a sealing unit 800 that seals the display region 200 with a sealing substrate (not shown) and a sealing member coated along an outer line of the display region 200, and a terminal region 700 on which various terminals are disposed. More than one organic or inorganic sealing layers and/or a metal layer may be used to seal the display region 200.

A driving power supply line 300, which supplies power to the display region 200, may be disposed between the display region 200 and the sealing unit 800. While the driving power supply line 300 may be arranged in various configurations, forming it to surround the display region 200 may improve brightness non-uniformity of the display region 200 since uniform driving power may be supplied to the entire display region.

The driving power supply line 300 is coupled with a driving line 310. The driving line 310 may be disposed across the display region 200, and it may be coupled with a drain electrode 170b, which is disposed under a protection layer 180 (refer to FIG. 2C).

Also, vertical/horizontal driving circuit units 500 and 600 are disposed outside the display region 200. The vertical circuit unit 500 may be a scan driving circuit unit that applies scan signals to the display region 200, and the horizontal driving circuit unit 600 may be a data driving circuit unit that applies data signals to the display region 200. The vertical/horizontal driving circuit units 500 and 600 may be disposed outside the sealing region as an external integrated circuit (IC) or chip on glass (COG) unit.

An electrode power supply line 410, which supplies electrode power to the display region 200, may be disposed outside the display region 200. The electrode power supply line 410 may be electrically coupled to a second electrode layer 400, which is formed on the entire surface of the display region 200, through via holes 430 in insulating layers formed between the electrode power supply line 410 and the second electrode layer 400.

The driving power supply line 300, the electrode power supply line 410, and the vertical/horizontal driving circuit units 500 and 600 may be electrically coupled with a terminal region 700, which respectively includes terminals 320, 420, 520, and 620 disposed outside the sealing region, through wires.

Figure 2B:
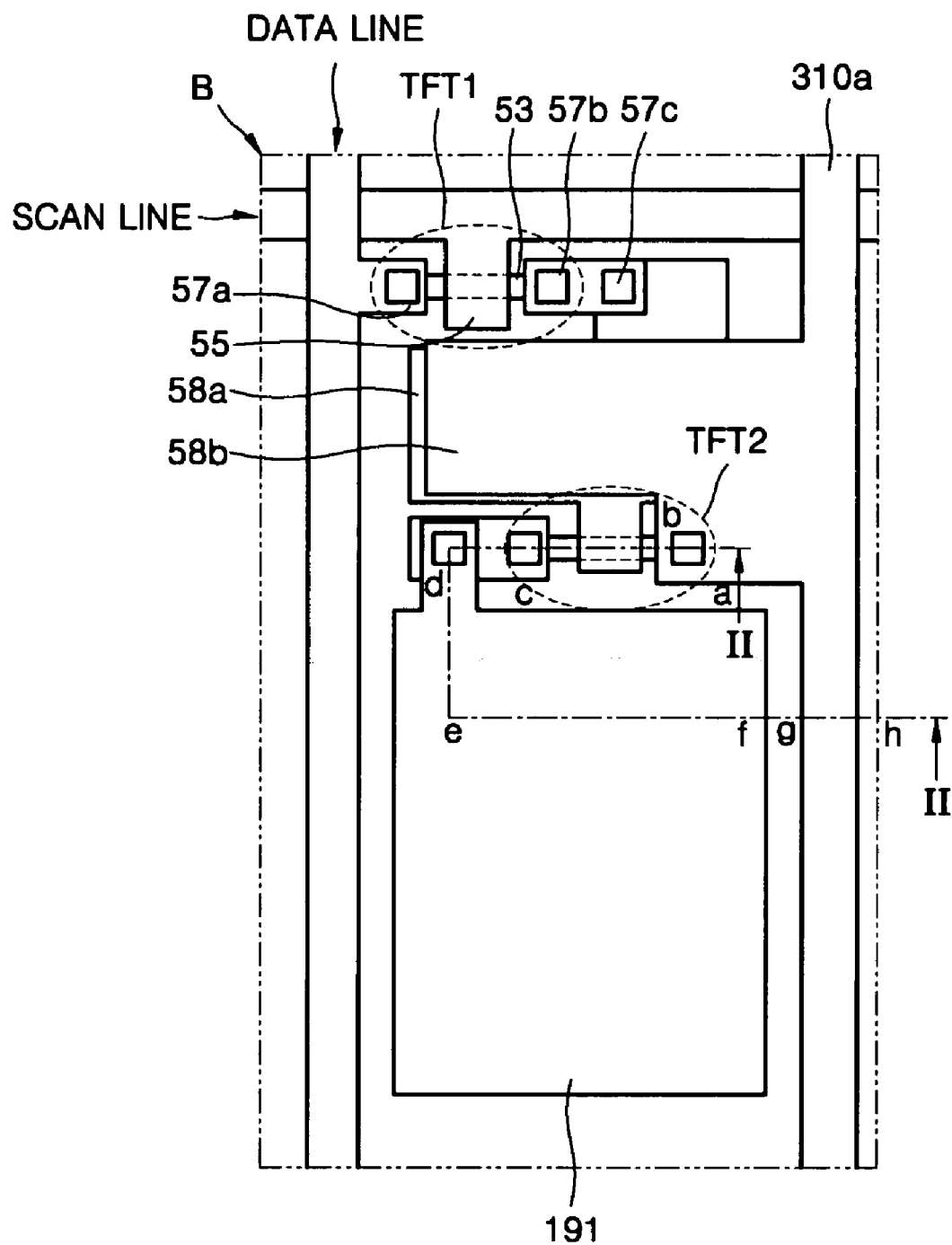
FIG. 2B is a magnified plan view of portion "B" of FIG. 2A.

The display region 200 will now be described with reference to FIG. 2B and FIG. 2C, which omit the sealing substrate and a sealing thin film layer for convenience of explanation. FIG. 2B shows a pixel of the display region indicated as "B" in FIG. 2A. The pixel includes two top gate type thin film transistors and one capacitor, but the present invention is not limited thereto.

A gate electrode 55 of a first thin film transistor TFT1 extends from a scan line that applies a scan signal to select the pixel. When applying an electrical signal, such as a scan signal, to the scan line, a data signal from a data line transmits from a source electrode 57a through a semiconductor active layer 53 to a drain electrode 57b of the first thin film transistor TFT1.

An extension unit 57c of the drain electrode 57b may be coupled to an end of a first electrode 58a of a capacitor, and the other end of the first electrode 58a of the capacitor may form a gate electrode 150 of a second thin film transistor TFT2, which is a driving thin film transistor. A second electrode 58b of the capacitor may be coupled to a driving line 310a.

FIG. 2C is a cross-sectional view taken along line II-II in FIG. 2B. A portion a-e of the line II-II is a cross-section on which a driving thin film transistor TFTdr is disposed, a portion e-f is a cross-section of a pixel opening 190, and a portion g-h is a cross-section of driving line 310a.

Referring to FIG. 2C, a TFT layer RT, an insulating layer 179, for protecting or planarizing the TFT layer $R_T$, and a pixel layer $R_P$, to which electric signals from the TFT layer $R_T$ are transmitted, may be formed on a surface of the substrate 110. The pixel layer $R_P$ includes the first electrode layer 191, the second electrode layer 400 and an intermediate layer 194, including at least an emitting layer, interposed between the first electrode layer 191 and the second electrode layer 400.

A detailed structure will now be described with reference to FIG. 3A, FIG. 3B, FIG. 3C, FIG. 3D, and FIG. 3E for describing a method of manufacturing an organic electroluminescence display device according to an exemplary embodiment of the present invention.

Figure 3A:
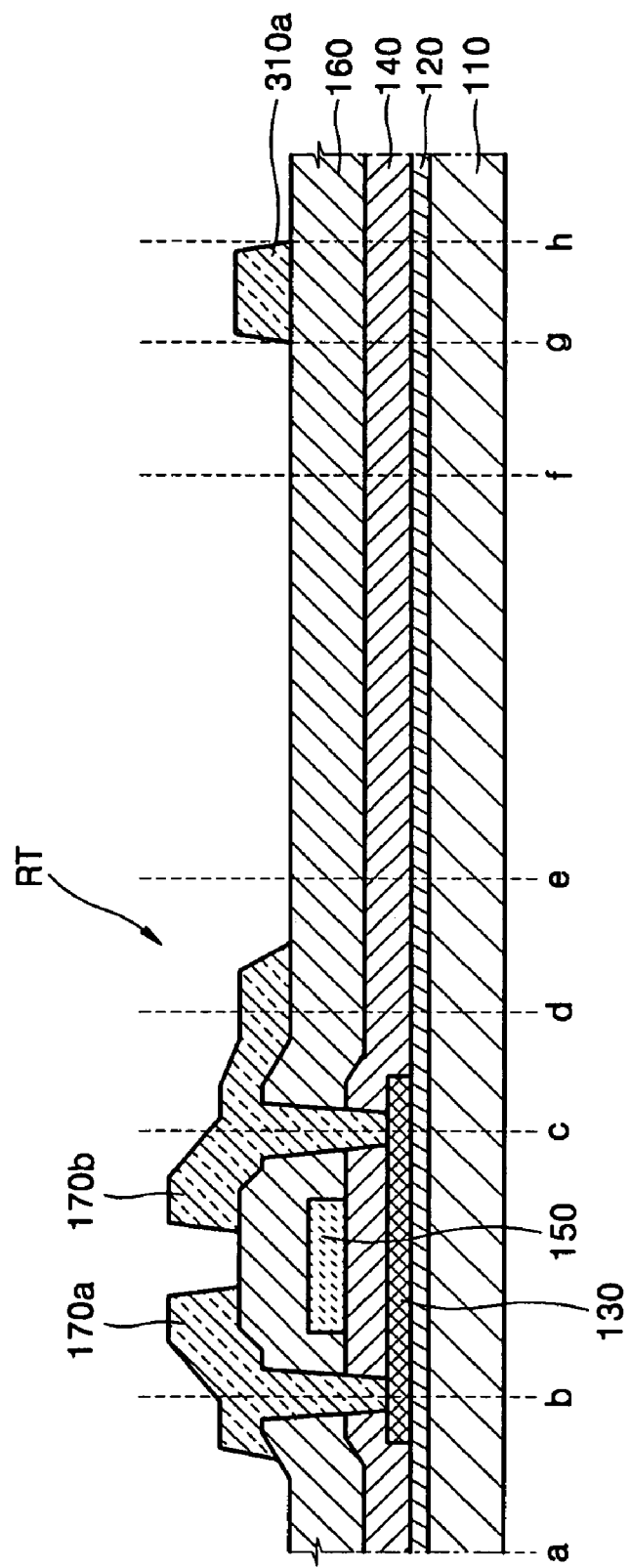
FIG. 3A, FIG. 3B, FIG. 3C, FIG. 3D and FIG. 3E are cross-sectional views is showing a method of manufacturing an organic electroluminescence display device according to an exemplary embodiment of the present invention.

First, as FIG. 3A shows, a TFT layer $R_T$ including a second thin film transistor TFT2 for applying an electrical signal to a pixel layer is provided on the substrate 110.

A semiconductor active layer 130 of the second thin film transistor TFT2 may be formed on a buffer layer 120, which may be formed on a surface of the substrate 110. The semiconductor active layer 130 may be an amorphous silicon layer or a poly silicon layer. Though it is not depicted in detail, the semiconductor active layer 130 includes source and drain regions doped with an N-type dopant or a P-type dopant and a channel region. The semiconductor active layer 130 can be formed of a variety of materials such as, for example, an organic semiconductor.

A gate insulating layer 140 may be formed on the semiconductor active layer 130 and the buffer layer 120, and a gate electrode 150 of the second thin film transistor TFT2 is disposed on a surface of the gate insulating layer 140. The gate electrode 150 may be made of a material, such as, for example, MoW and Al/Cu, considering its adherence to an adjacent layer, flatness of stacked layers, and process ability.

An interlayer 160, which may be a single or multiple layer insulating layer, may be formed on the gate electrode 150 and the gate insulating layer 140. Source/drain electrodes 170a and 170b of the second thin film transistor TFT2 are then formed on the interlayer 160. The source/drain electrodes 170a and 170b can be formed of, for example, at least one of MoW or Al (i.e. a single layer of MoW or a multiple layer of Mo/Al). The source/drain electrodes 170a and 170b may be subsequently heat treated for a smooth ohmic contact with the semiconductor active layer 130.

Figure 3B:
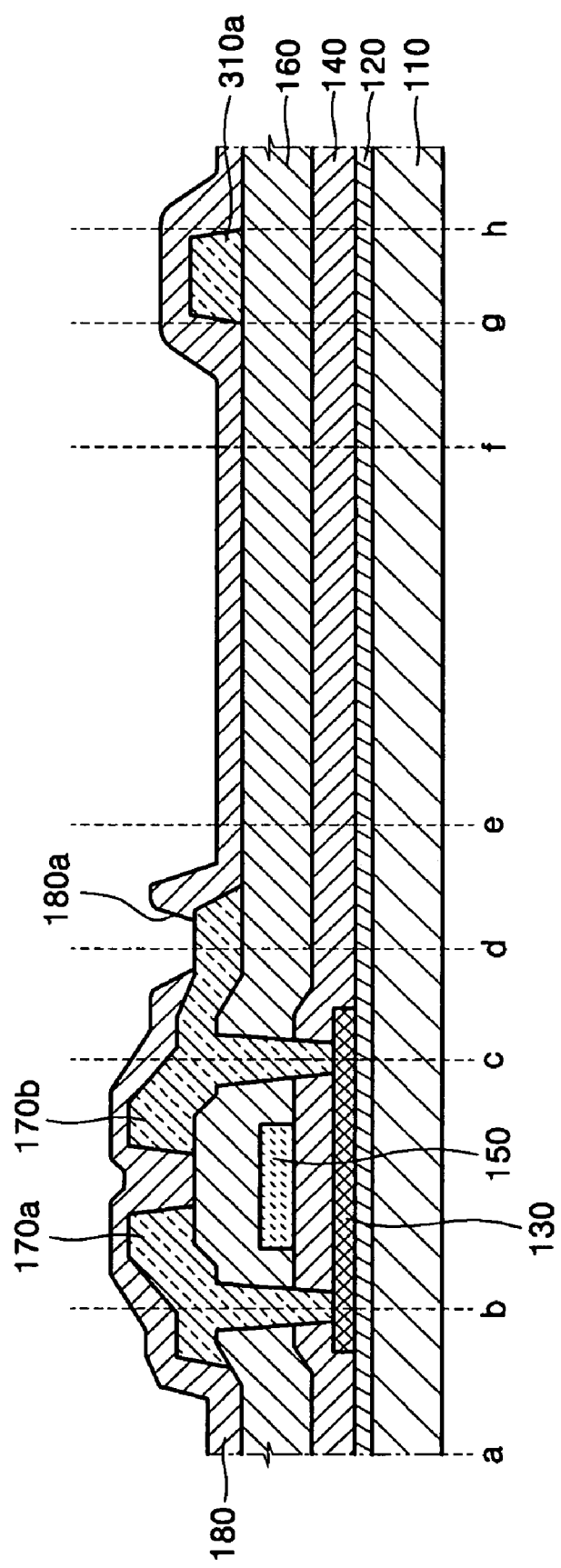
Figure 3C:
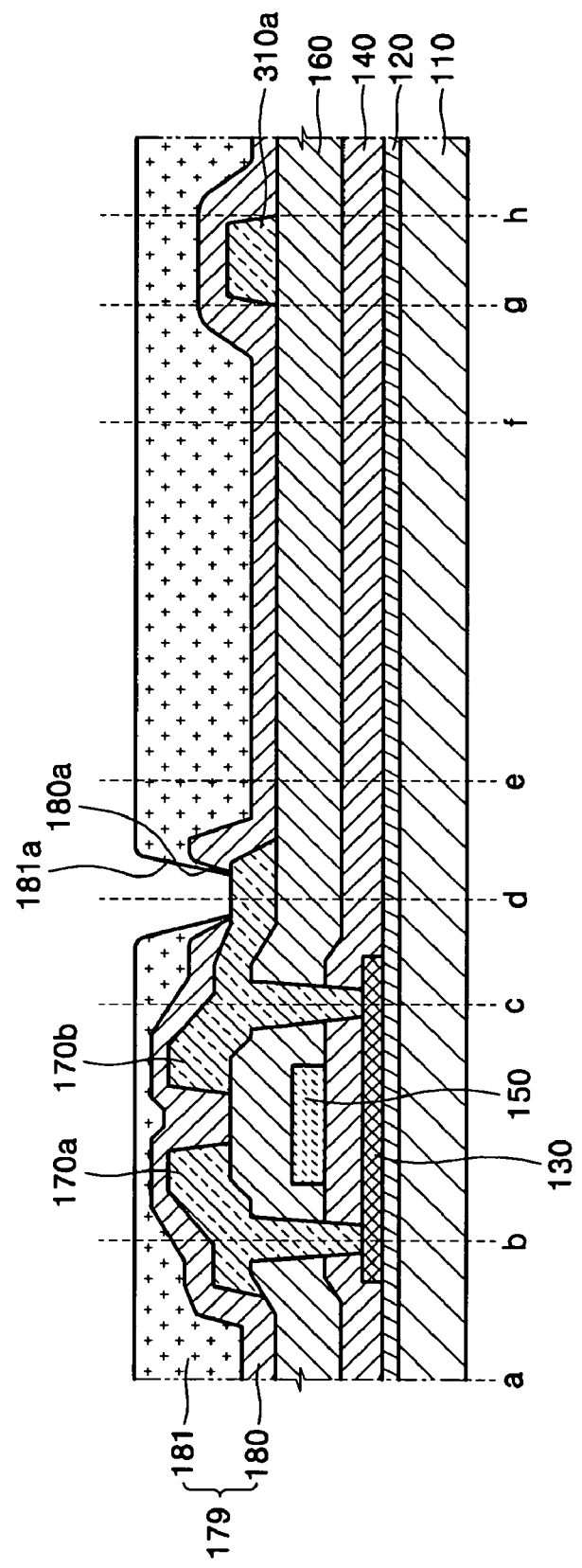

Referring to FIG. 3B and FIG. 3C, at least one insulating layer 179 is formed on the source/drain electrodes 170a and 170b. The insulating layer 179 comprises a passivation layer 180, which protects the TFT layer formed thereunder and/or a planarizing layer 181 for planarizing the lower TFT layer. For example, the passivation layer 180 can be formed of an inorganic material, such as SiNx and SiO2, and the planarizing layer 181 can be formed of an organic material, such as benzocyclobutene (BCB) or acryl.

After forming the insulating layer 179, via holes 180a and 181a, which couple a subsequently formed first electrode layer 191 and one of the source/drain electrodes 170a and 170b, may be formed in the insulating layer 179. In FIG. 3B and FIG. 3C, the insulating layer 179 includes the passivation layer 180 and the planarizing layer 181, and the via holes 180a and 181a are formed after forming the passivation layer 180 and the planarizing layer 181, respectively. More specifically, as FIG. 3B shows, an inorganic material, such as SiNx, may be formed on the source/drain electrodes 170a and 170b and the interlayer 160 using a Plasma Enhanced Chemical Vapor Deposition (PECVD) method. After forming the passivation layer 180, a first via hole 180a may be formed in the passivation layer 180 to expose at least a portion of the drain electrode 170b. Next, as FIG. 3C shows, a photosensitive material, such as acryl, may be coated on the entire surface of the passivation layer 180 including the first via hole 180a, and a second via hole 181a may then be formed using a photolithography method.

Figure 3D:
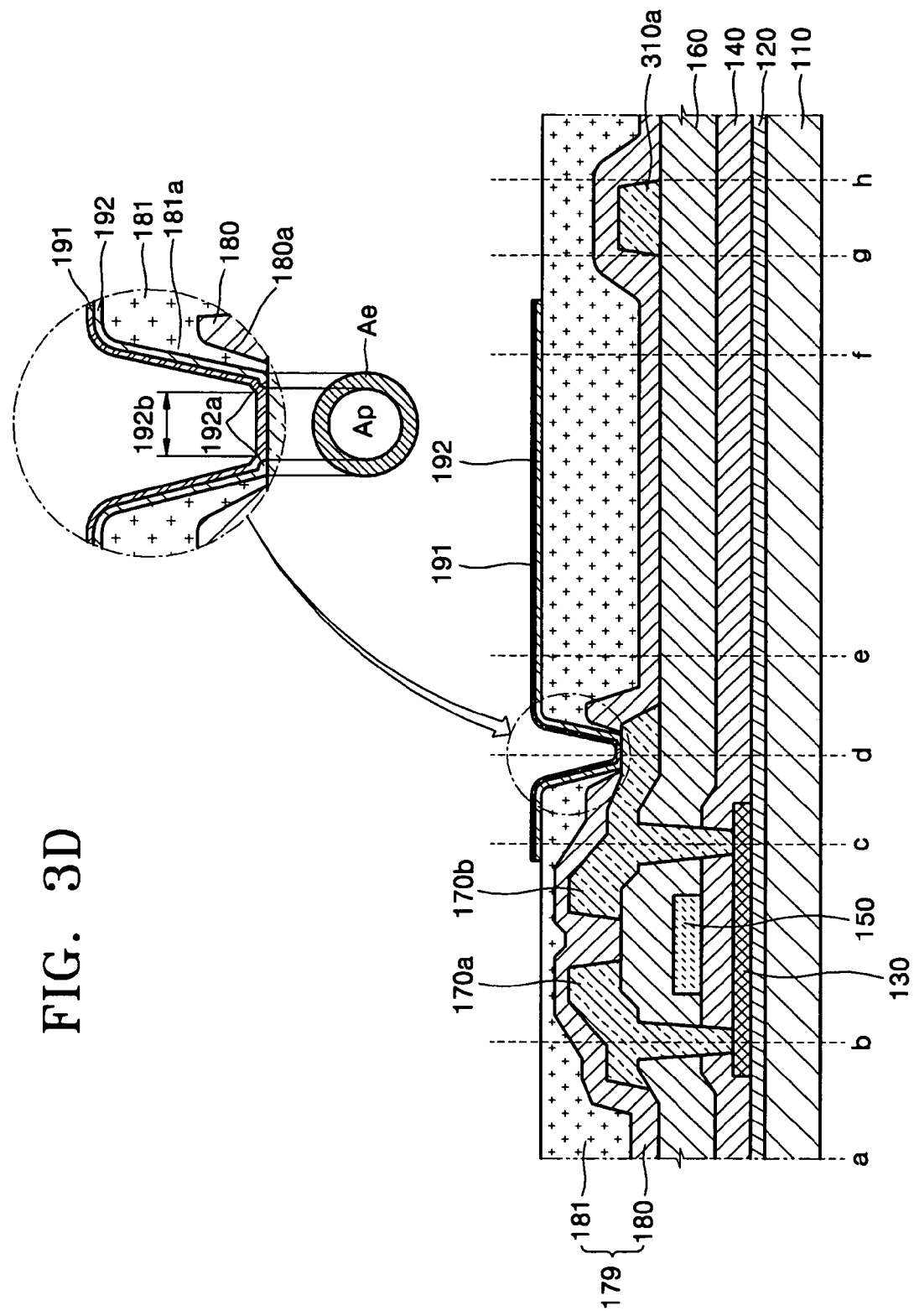

Next, as FIG. 3D shows, a reflection layer 192 may be formed on a surface of the planarizing layer 181 including the second via hole 181a. The reflection layer 192 can be formed of a highly reflective material, such as, for example, Al or AlNd. The reflection layer 192 can be patterned to a desired structure after depositing a reflective material on an entire surface of the substrate. The first electrode layer 191 may then be formed on a surface of the reflection layer 192.

The reflection layer 192 includes an extension unit 192a, which is formed on a lower surface of the second via hole 181a, and a through hole 192b, which is surrounded by the extension unit 192a. Accordingly, the first electrode layer 191 extends to the lower surface of the second via hole 181a and directly contacts the drain electrode 170b through the through hole 192b included in the reflection layer 192. The size of the through hole 192b formed in the reflection layer 192 may be selected in order to prevent increased contact resistance. More specifically, the contact area Ap between the first electrode layer 191 and the drain electrode 170b may be greater than the contact area Ae between the extension unit 192a of the reflection layer 192 and the drain electrode 170b. Also, although the through hole 192b is shown as a circle in FIG. 3D, it may have various shapes.

Figure 3E:
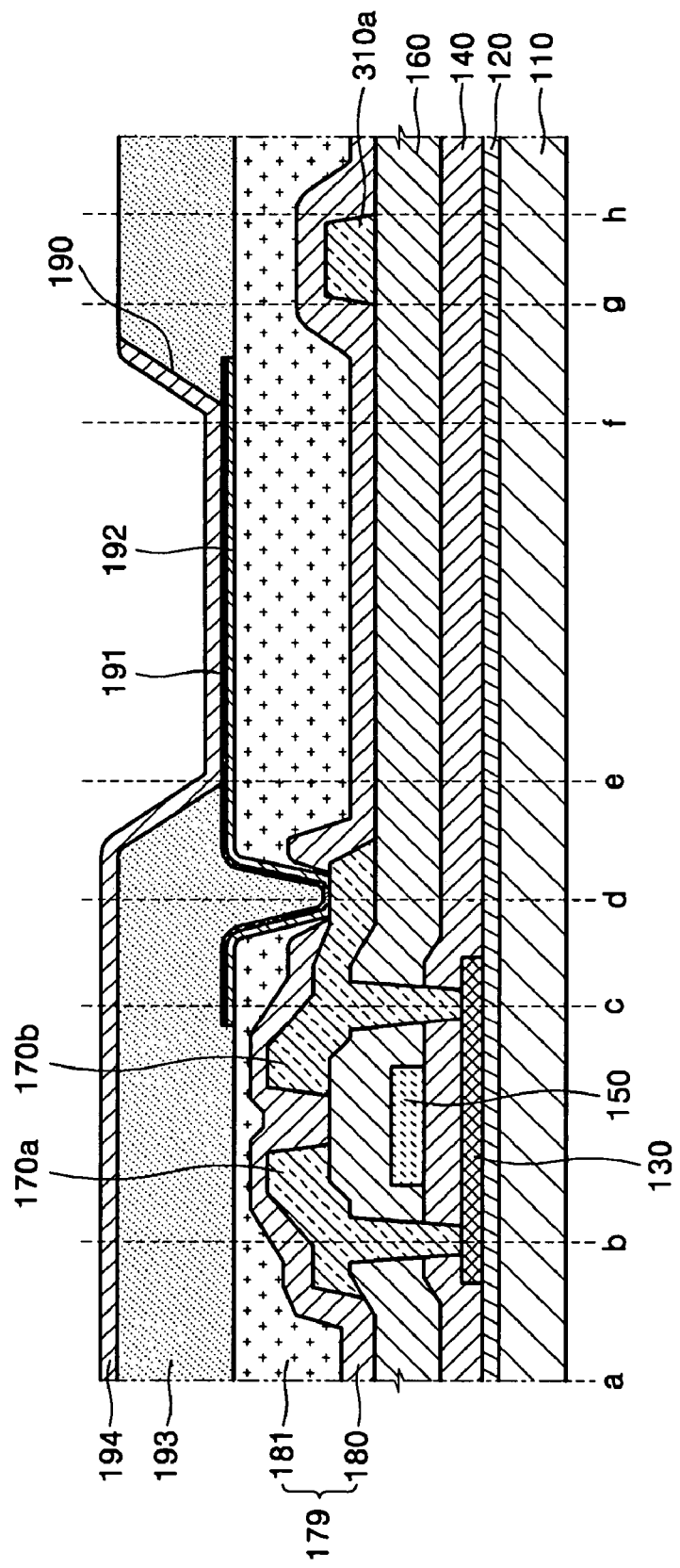

After forming the first electrode layer 191, as FIG. 3E shows, a pixel defining layer 193 may be formed on at least a portion of the first electrode layer 191 so that at least a portion of the first electrode layer 191 can constitute a pixel opening 190, and an intermediate layer 194, which includes an organic light emitting layer, may be formed on the exposed surface of the first electrode layer 191. The organic electroluminescence display device can then be formed by forming the second electrode layer 400 over the display region 200, as shown in FIG. 2A and FIG. 2C.

The intermediate layer 194 having the organic light emitting layer can be formed of a low molecular weight or polymer organic film. If formed of a low molecular weight organic film, the intermediate layer 194 can be formed in a single or a composite structure by stacking a Hole Injection Layer (HIL), a Hole Transport Layer (HTL), the emitting layer, an Electron Transport Layer (ETL), and an Electron Injection Layer (EIL). An organic material that can be used for forming the intermediate layer 194 includes, for example, copper phthalocyanine (CuPc), N,N'-Di(naphthalene-1-yl)-N,N'-diphenyl-benzidine (NPB), and tris-8-hydroxyquinoline aluminum (Alq3). The low molecular weight organic film can be formed by, for example, an evaporation method.

If the intermediate layer 194 is formed of a polymer organic film, it can have a structure including a HTL and the emitting layer. In this case, the HTL can be formed of, for example, PEDOT and the EML can be formed of, for example, Poly-Phenylenevinylene (PPV) and Polyfluorene. The polymer organic film can be formed by various methods including a screen printing method or an ink jet printing method.

The second electrode layer 400 (a cathode) may be deposited on the entire surface of the substrate in the display region, but is not limited thereto. The second electrode layer 400 can be formed of material such as, for example, Al/Ca, ITO, and Mg—Ag according to the type of emission, it may comprise a single or a multiple layer, or it can further include an alkali or alkali earth fluoride layer such as a LiF layer.

<Experiment>

After depositing 5000 Å thick source/drain electrodes and patterning, a 1000 Å thick SiNx passivation layer was formed using a PECVD method on the source/drain electrodes, and a first via hole was formed in the passivation layer to expose a portion of the drain electrode. After forming a planarizing layer using acryl on the passivation layer, a second via hole was formed using a photolithography method. A 1000 Å thick reflection layer was formed of AlNd using sputtering and then patterned.

<Experiment 1 (Comparison to the Present Invention)>

Figure 4A:
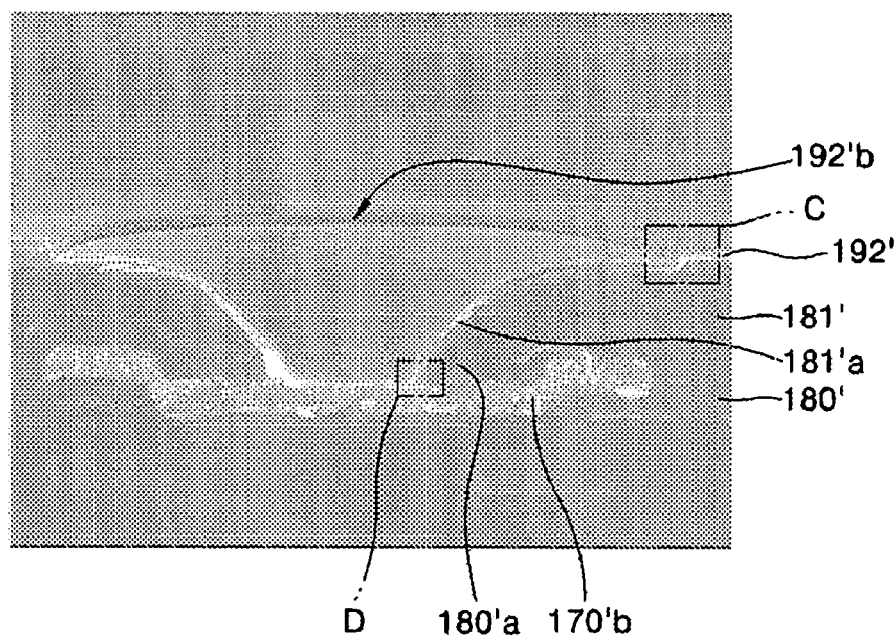
FIG. 4A is a partial cross-sectional view showing an organic electroluminescence display device for comparison with an embodiment of the present invention.
Figure 4B:
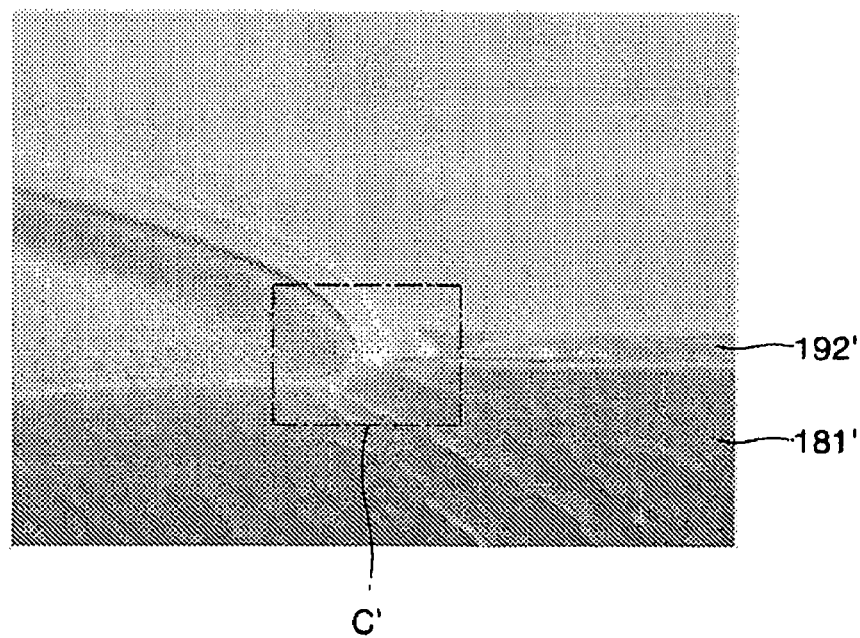
FIG. 4B, FIG. 4C and FIG. 4D are cross-sectional views showing portions of FIG. 4A.
Figure 4C:
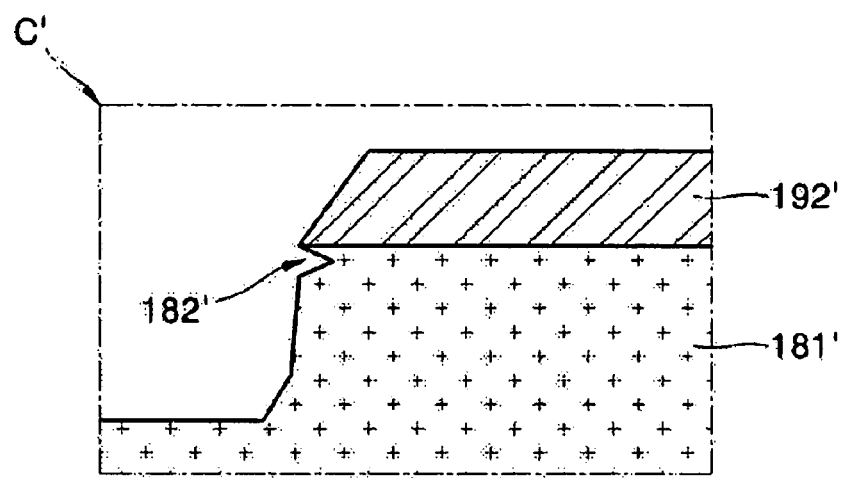

The comparison embodiment with respect to the present invention is depicted in FIG. 4A, FIG. 4B and FIG. 4C.

In FIG. 4A, a through hole of the AlNd reflection layer 192' is formed outside a via hole 181'a, and a pasivation layer 180' and a planarizing layer 181' are formed on a surface of a drain electrode 170'b. A first via hole 180'a and a second via hole 181'a are respectively formed in the pasivation layer 180' and the planarizing layer 181'.

FIG. 4B is a magnified cross-sectional view of portion C of FIG. 4A, which is an outside of a through hole when using dry etching for patterning the reflection layer 192', and FIG. 4C is a magnified cross-sectional view of portion C' of FIG. 4B. The through hole 192'b is formed when patterning the reflection layer 192' using dry etching. In this case, it may not secure enough step coverage with respect to the thinner first electrode layer that will be formed in a subsequent process by over etching the planarizing layer 181' along the inner side of the through hole 192'b and/or generating an overhang phenomenon, i.e., forming a recess unit 182' between the reflection layer 192' and the planarizing layer 181'. Therefore, an electrical signal applied to the first electrode layer may have a different value from a set value, thereby generating brightness non-uniformity or reducing brightness of the corresponding pixels and eventually of the display region.

Figure 4D:
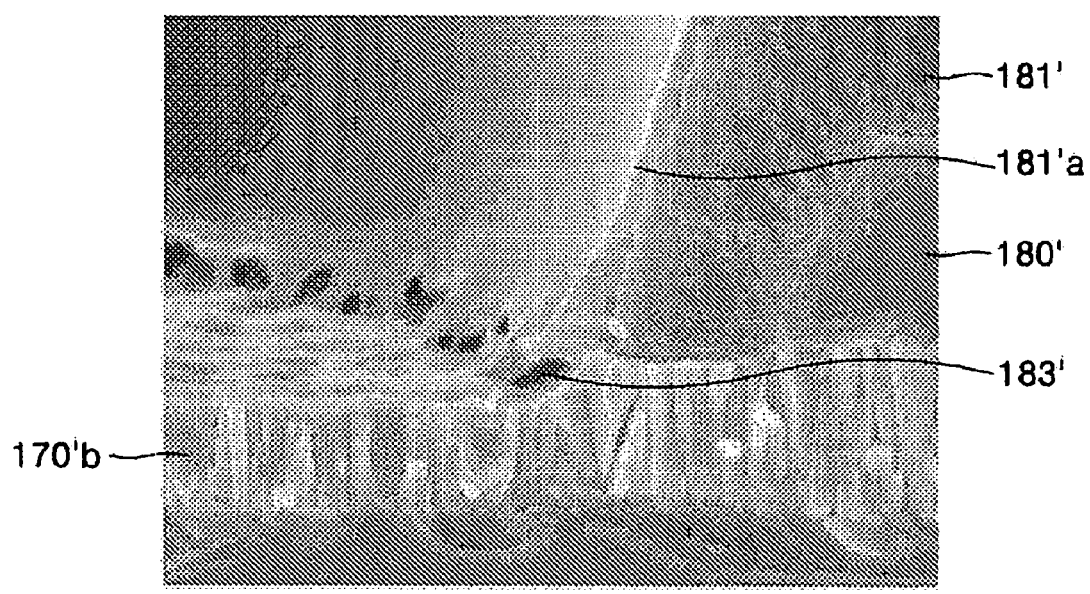

FIG. 4D is a magnified cross-sectional view of section D of FIG. 4A, which shows a lower surface of the via hole 181'a when using wet etching for patterning the reflection layer 192' of FIG. 4A. Here, an undercut 183' may be generated on a lower part of the planarizing layer 181' as an insulating layer formed on a side surface of the via hole 181'a by eroding the drain electrode 170'b exposed on a lower surface of the via hole 181'a by wet etching. This can cause a brightness non-uniformity or reduce brightness of the corresponding pixels by opening a portion of the first electrode layer when the first electrode layer is formed on a surface of the reflection layer 192' including the via hole 181'a in a subsequent process.

<Experiment 2 (the Present Invention)>

Figure 5A:
FIG. 5A and FIG. 5B are partial cross-sectional views showing a thin film transistor layer according to an exemplary embodiment of the present invention.

The extension unit 192a of the reflection layer 192 formed of Al—Nd, according to an exemplary embodiment of the present invention, is patterned to extend to a lower surface of the second via hole 181a. FIG. 5A is a partial cross-sectional view of a lower surface of a via hole after patterning a reflection layer using wet etching, and FIG. 5B is a cross-sectional view of a lower surface of a via hole after patterning the reflection layer using dry etching.

Here, though not shown in the drawing, the opening or damage of the first electrode layer due to the step difference where the via hole 181'a begins can be prevented when the first electrode layer is subsequently formed on a surface of the reflection layer 192 by extending the reflection layer 192 to at least a portion of a lower surface of the via hole 181a.

Figure 5B:

Also, as FIG. 5A and FIG. 5B show, the first electrode layer 191, which will be formed in a subsequent process, can secure enough step coverage even nearby the via hole 181a by interposing the extension unit 192a of the reflection layer 192 on a lower surface of the via hole 181a. Also, the opening of a portion of the first electrode layer 191 can be prevented by minimizing the damage of the drain electrode 170b, which can be caused during patterning, and by preventing an undercut that can occur in the planarizing layer, which is an insulating layer formed on a side surface of the via hole 181a. Hence, the brightness reduction or non-uniformity may be prevented by securing enough step coverage and preventing the formation of an opening region of the first electrode layer.

The present invention is not limited to the embodiments described above. For example, while the embodiments of the present invention are described with respect to an organic electroluminescent display device, the invention may also be applied to an inorganic electroluminescent display device.

According to exemplary embodiments of the present invention, the following advantages are provided.

First, in an electroluminescence display device that includes a reflection layer, directly connecting a first electrode layer and a source/drain electrode may reduce a voltage drop that can occur when coupling a TFT layer to a pixel layer, thereby improving brightness in the display region.

Second, a severe step difference and/or an undercut nearby an inner side of a via hole can be prevented, regardless of the type of patterning process used for the reflection layer, by extending the reflection layer to a lower portion of the via hole. Accordingly, pixel failure or reduced brightness due to the discontinuity of the first electrode layer formed on a surface of the reflection layer can be prevented.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An electroluminescence display device, comprising:
a thin film transistor layer on a substrate;

at least one insulating layer on the thin film transistor layer; and a pixel layer that includes a first electrode layer, a second electrode layer, and an intermediate layer having at least an emitting layer interposed between the first electrode layer and the second electrode layer, and is disposed on the insulating layer, wherein the pixel layer further includes a reflection layer that contacts either a source electrode or a drain electrode of the thin film transistor layer, and is disposed below the first electrode layer, and wherein the reflection layer includes a through hole through which the first electrode layer contacts either the source electrode or the drain electrode.

2. The electroluminescence display device of claim 1, wherein a contact area between the first electrode layer and either the source electrode or the drain electrode is greater than a contact area between the reflection layer and either the source electrode or the drain electrode.

3. The electroluminescence display device of claim 1, wherein the source electrode and the drain electrode include at least one of Mo or Al.

4. The electroluminescence display device of claim 1, wherein the insulating layer includes a via hole which exposes either the source electrode or the drain electrode, and wherein a size of the via hole is larger than that of the through hole.

5. An electroluminescence display device, comprising:
a plurality of pixels in a display region; and
a thin film transistor and a light emitter in a pixel, the light emitter including a reflective layer and a first electrode layer;

wherein the light emitter is coupled to an electrode of the thin film transistor through a via hole in an insulating layer, wherein the reflective layer and the first electrode layer contact the electrode of the thin film transistor.

6. The electroluminescence display device of claim 5, wherein the reflective layer contacts the electrode of the thin film transistor through the via hole, and the first electrode layer contacts the electrode of the thin film transistor through a through hole in the reflective layer.

7. The electroluminescence display device of claim 6, wherein a contact area between the first electrode layer and the electrode of the thin film transistor is greater than a contact area between the reflection layer and the electrode of the thin film transistor.

8. The electroluminescence display device of claim 7, wherein the light emitter further comprises an intermediate layer formed on the first electrode layer and having at least an emitting layer, and a second electrode layer formed on the emitting layer.

9. The electroluminescence display device of claim 6, wherein the via hole and the through hole have a circular shape at a lower surface of via hole.

10. The electroluminescence display device of claim 6, wherein a size of the via hole is larger than that of the through hole.

* * * * *